(12) United States Patent
Christoph

(10) Patent No.: US 10,283,107 B2
(45) Date of Patent: May 7, 2019

(54) SCALED NOISE AND VIBRATION SENSING

(71) Applicant: Harman Becker Automotive Systems GmbH, Karlsbad (DE)

(72) Inventor: Markus Christoph, Straubing (DE)

(73) Assignee: Harman Becker Automotive Systems GmbH, Karlsbad (DE)

(*) Notice: Subject to any disclaimer, the term of this patent is extended or adjusted under 35 U.S.C. 154(b) by 0 days.

(21) Appl. No.: 15/768,766

(22) PCT Filed: Oct. 10, 2016

(86) PCT No.: PCT/IB2016/056045
§ 371 (c)(1),
(2) Date: Apr. 16, 2018

(87) PCT Pub. No.: WO2017/064602
PCT Pub. Date: Apr. 20, 2017

(65) Prior Publication Data
US 2018/0308468 A1    Oct. 25, 2018

(30) Foreign Application Priority Data
Oct. 16, 2015   (EP) .................................. 15190173

(51) Int. Cl.
*G01H 1/12* (2006.01)
*G01H 1/14* (2006.01)
(Continued)

(52) U.S. Cl.
CPC ......... *G10K 11/17861* (2018.01); *G01H 1/12* (2013.01); *G01H 1/14* (2013.01);
(Continued)

(58) Field of Classification Search
CPC ............ H04R 2420/07; H04R 2460/13; H04R 2499/11; H04R 17/00; H04R 1/02;
(Continued)

(56) References Cited

U.S. PATENT DOCUMENTS 4,715,559 A * 12/1987 Fuller .................. G10K 11/178
244/1 N
5,418,858 A * 5/1995 Shoureshi ............ B60G 17/018
381/71.2
(Continued)

FOREIGN PATENT DOCUMENTS

WO         0038173 A1    6/2000

*Primary Examiner* — Lun-See Lao
(74) *Attorney, Agent, or Firm* — Brooks Kushman P.C.

(57) ABSTRACT

Noise and vibration sensing includes generating with an acceleration sensor a sense signal representative of the acceleration that acts on the acceleration sensor, and processing the sense signal to provide a processed sense signal having an adjustable signal bandwidth and an adjustable signal dynamic. The signal bandwidth extends between a lowest frequency and a highest frequency of the sense signal, and the signal dynamic is the ratio between a maximum amplitude of the sense signal and an output noise floor generated by the acceleration sensor. Noise and vibration sensing further includes adjusting the signal bandwidth and the signal dynamic in accordance with a control signal so that the signal bandwidth increases when the signal dynamic decreases and vice versa.

20 Claims, 3 Drawing Sheets

(51) Int. Cl.
*G01H 1/16* (2006.01)
*H03G 5/16* (2006.01)
*H03G 5/18* (2006.01)
*G10K 11/178* (2006.01)

(52) U.S. Cl.
CPC ............ *G01H 1/16* (2013.01); *G10K 11/178* (2013.01); *G10K 11/1781* (2018.01); *H03G 5/18* (2013.01); *G10K 2210/129* (2013.01); *G10K 2210/1282* (2013.01); *G10K 2210/3213* (2013.01); *G10K 2210/3229* (2013.01); *G10K 2210/501* (2013.01); *G10K 2210/512* (2013.01); *H03G 5/16* (2013.01)

(58) Field of Classification Search
CPC .... H04R 1/086; H04R 1/1041; H04R 1/1075; H04R 1/1083; H04R 2225/61; H04R 2410/05; H04R 2460/01; H04R 2460/17; H04R 2499/13; H04R 25/606; H04R 29/001; H04R 3/12; H04R 5/02; H04R 5/033; H04R 5/04; H04L 67/12; H04L 1/0002; H04L 5/0064; H04L 67/1097; H04L 67/10; H04L 67/125; H04L 12/16; H04L 67/42; H04L 12/189; H04L 12/6418; H04L 1/0003; H04L 1/0013; H04L 2012/6421; H04L 2012/6427; H04L 27/148; H04L 27/262; H04L 51/04; H04L 51/24; H04L 5/0053; H04L 5/0094; H04L 63/0853; H04L 67/02; H04L 67/306; H04L 7/0331; H04L 9/00; H04L 9/3242; H04L 17/318; H04L 17/309
USPC ........................ 381/71.1–71.6, 86, 94.1–94.4
See application file for complete search history.

(56) References Cited

U.S. PATENT DOCUMENTS

| | | | |
|---|---|---|---|
| 5,638,454 A * | 6/1997 | Jones ................... | G10K 11/178 381/71.14 |
| 2008/0157940 A1* | 7/2008 | Breed .................... | B60C 11/24 340/425.5 |
| 2008/0216567 A1* | 9/2008 | Breed .................... | B60C 11/24 73/146.5 |
| 2009/0212867 A1* | 8/2009 | Fukuzawa ................ | H03G 5/24 330/284 |
| 2013/0208908 A1 | 8/2013 | Theiler et al. | |

* cited by examiner

SCALED NOISE AND VIBRATION SENSING

CROSS-REFERENCE TO RELATED APPLICATION

This application is the U.S. national phase of PCT Application No. PCT/IB2016/056045 filed on Oct. 10, 2016, which claims priority to EP Patent Application No. 15190173.3 filed on Oct. 16, 2015, the disclosures of which are incorporated in their entirety by reference herein.

FIELD

The disclosure relates to scaled noise and vibration sensing, particularly for active road noise control systems and active engine noise control systems, and to scaled noise and vibration measurement methods.

BACKGROUND

Road noise control (RNC) technology reduces unwanted road noise inside a car by generating anti-noise, which is generating sound waves that are opposite in phase to the sound waves to be reduced, in a similar manner as with automatic noise control (ANC) technology. RNC technology uses noise and vibration sensors to pick up unwanted sound (noise) and vibrations generated from tires, car body components, and rough road surfaces that cause or transfer noise and vibrations. The result of canceling such unwanted sound is a more pleasurable ride, and enables car manufacturers to use lightweight chassis materials, thereby increasing fuel mileage and reducing emissions. Engine noise control (ENC) technology uses a signal representative of the engine sound as a reference to generate a sound wave that is opposite in phase to the engine sound audible in the car interior. As a result, ENC makes it easier to reduce the use of conventional damping materials. In both systems, additional error microphones mounted in the car interior may provide feedback on the amplitude and phase to refine noise reducing effects. However, the two technologies require different, very specific noise and vibration (N&V) sensor arrangements throughout the vehicle structure in order to observe road noise and engine related noise and vibration signals.

SUMMARY

An example scalable noise and vibration sensor includes an acceleration sensor configured to generate a sense signal representative of the acceleration that acts on the acceleration sensor, and a sense signal processing module configured to process the sense signal to provide a processed sense signal having an adjustable signal bandwidth and an adjustable signal dynamic. The signal bandwidth extends between a lowest frequency and a highest frequency of the sense signal, and the signal dynamic is the ratio between a maximum amplitude of the sense signal and an output noise floor generated by the acceleration sensor. The sense signal processing module is further configured to adjust the signal bandwidth and the signal dynamic in accordance with a control signal so that the signal bandwidth increases when the signal dynamic decreases and vice versa.

An example noise cancellation arrangement includes a road noise cancellation system, an engine noise control system, and a scalable noise and vibration sensor connected to the road noise cancellation system and the engine noise control system.

An example noise and vibration sensing method includes generating with an acceleration sensor a sense signal representative of the acceleration that acts on the acceleration sensor, and processing the sense signal to provide a processed sense signal having an adjustable signal bandwidth and an adjustable signal dynamic. The signal bandwidth extends between a lowest frequency and a highest frequency of the sense signal, and the signal dynamic is the ratio between a maximum amplitude of the sense signal and an output noise floor generated by the acceleration sensor. The method further includes adjusting the signal bandwidth and the signal dynamic in accordance with a control signal so that the signal bandwidth increases when the signal dynamic decreases and vice versa.

BRIEF DESCRIPTION OF THE DRAWINGS

The disclosure may be better understood by reading the following description of non-limiting embodiments in connection with the attached drawings, in which like elements are referred to with like reference numbers, wherein below.

DETAILED DESCRIPTION

Noise and vibration sensors as described herein may include acceleration sensors such as accelerometers, force gauges, load cells, etc. For example, an accelerometer is a device that measures proper acceleration. Proper acceleration is not the same as coordinate acceleration, which is the rate of change of velocity. Single- and multi-axis models of accelerometers are available for detecting magnitude and direction of the proper acceleration, and can be used to sense orientation, coordinate acceleration, motion, vibration, and shock.

For example, noise and vibration sensors for use in RNC systems or ENC systems have to cope with different requirements set by these systems. For example, noise and vibration sensors employed in a RNC system should ideally exhibit a high dynamic range due to the significant noise floor of such sensors, but do not need to cover a broad spectral range for operation because structure-borne noise is essentially limited to a frequency range with an upper cut-off-frequency of approximately 500 [Hz]. In contrast, sensors applied in ENC systems do not need to operate in a wide dynamic range due to the fact that the desired spectral engine noise component stands out clearly from the noise floor, but should cover a larger spectral range as these signals are spread throughout a much wider spectral range, e.g. in a frequency range with an upper spectral cut-off frequency of approximately 1.5 [kHz] or even higher.

Below, sensors are described whose bandwidth-dynamic-product (BDP) can be adjusted, which means sensors that allow for increasing the dynamic of the sensors by reducing the spectral operational range at the same time and vice versa, so that they are applicable even in connection with various systems at the same time. If digital sensors are used, a constant BDP would also lead to a constant data rate, as peaks in the data flow are to be avoided as much as possible. A sensor adaptable (e.g., scalable) to a multiplicity of applications allows for the subsequent signal processing to operate in a more efficient and accurate way. In addition, by providing such a versatile sensor, a single sensor can operate in a multiplicity of applications in a cost and space saving manner.

Figure 1:
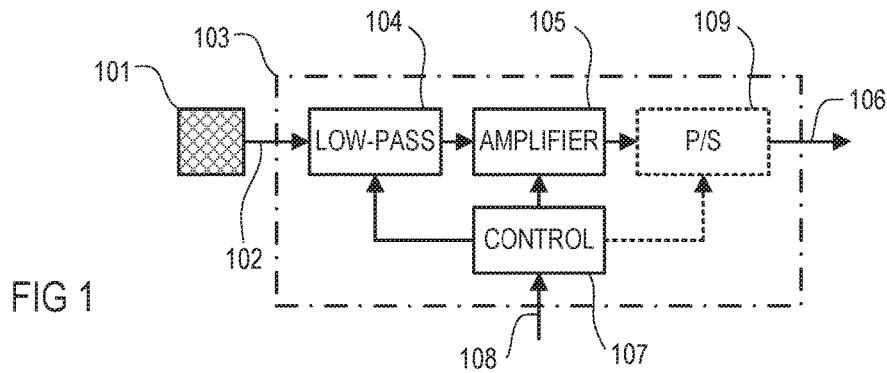
FIG. 1 is a schematic diagram illustrating an exemplary simple scalable noise and vibration sensor.

Referring to FIG. 1, a simple scalable noise and vibration sensor may include an acceleration sensor 101 which provides a sense signal 102, and further includes a sense signal processing module 103. The sense signal processing module 103 includes a low-pass filter 104 (or alternatively a band-pass filter) with controllable cut-off frequency and an amplifier 105 with controllable gain. In the example shown in FIG. 1, the low-pass filter 104 is connected downstream of the acceleration sensor 101 and the amplifier 105 is connected downstream of the low-pass filter 104. The amplifier 105 outputs a signal 106, whose BDP can be controlled by controlling the amplifier 105 and the low-pass filter 104. However, in an alternative noise and vibration sensor (not shown), the amplifier 105 may be connected downstream of the acceleration sensor 101 and upstream of the low-pass filter 104, wherein the low-pass filter 104 outputs the output signal 106. In any of the two cases, the low-pass filter 104 and the amplifier 105 may be controlled by a control module 107 that adjusts the bandwidth and the dynamic of the sense signal 102 in accordance with a control signal 108 so that the bandwidth increases when the dynamic decreases and vice versa.

The acceleration sensor 101 may be an analog or digital sensor, which means that sense signal 102 is either an analog or digital signal. In the case of an analog sense signal 102, the sense signal processing module 103 may employ solely analog signal processing with, e.g. analog filters and amplifiers, or mixed (analog and digital) signal processing as described below in connection with FIGS. 3 and 4. In the case of a digital sense signal 102, the sense signal processing module 103 may employ solely digital signal processing, e.g., the low-pass filter 104 may be a digital filter and the amplifier 105 may be a multiplier, shifter etc. Additionally or alternatively to the amplifier 105, digitally operating sense signal processing module 103 may include a controllable parallel-to-serial converter 109 connected downstream of the low-pass filter 104 and the amplifier 105, wherein the parallel-to-serial converter 109 is controlled by the control module 107 dependent on control signal 108 so that the sample rate is lower at a smaller bandwidth and higher at a larger bandwidth. Digital signal processing may be implemented as digital hardware or software or combination of hardware or software.

For example, if a digital line (e.g. bus) that transmits output signal 106 has a maximal data transmission rate X, with each data sample being quantized by a number N of bits, and the low-pass filter 104 has an upper cut-off-frequency of fc, wherein a sampling rate fs should at least have twice the value of fc, then the following connectedness holds true: $N \cdot fs \leq X$. Thus the sampling rate and, consequently, the bandwidth of the sense signal 102 are reduced and, at the same time, the number N of bits and, thus, the dynamic, is increased (and vice versa) to still meet the above requirement.

Figure 2:
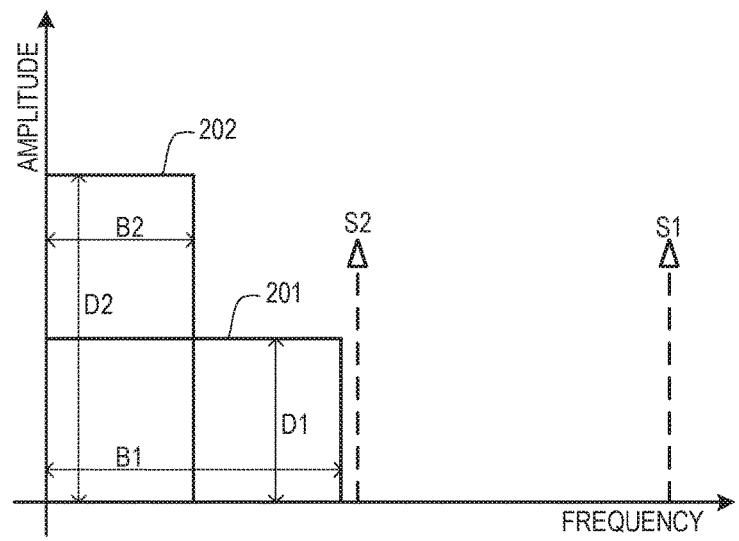
FIG. 2 is an amplitude vs. frequency diagram depicting the bandwidth dynamic relations for different dynamics and bandwidths.

FIG. 2 is an amplitude vs. frequency diagram depicting the bandwidth dynamic relations for two sensor output signals when the dynamic D1 is small and the bandwidth B1 is large (graph 201) and when the dynamic D2 is large and the bandwidth B2 is small (graph 202). To maintain a constant BDP, the product of bandwidth B1 and dynamic D1 has to equal the product of bandwidth B2 and dynamic D2, which means $B1 \cdot D1 = B2 \cdot D2 = BDP = $ constant. In digital signal processing, the number of bits N represents the amplitude. In the present example, the bandwidth B1 is twice the bandwidth B2, the dynamic D2 is twice the dynamic D1 and, in the case of digital processing, a sampling rate (frequency) S1 corresponding to bandwidth B1 is twice a sampling rate (frequency) S2 corresponding to bandwidth B2.

Figure 3:
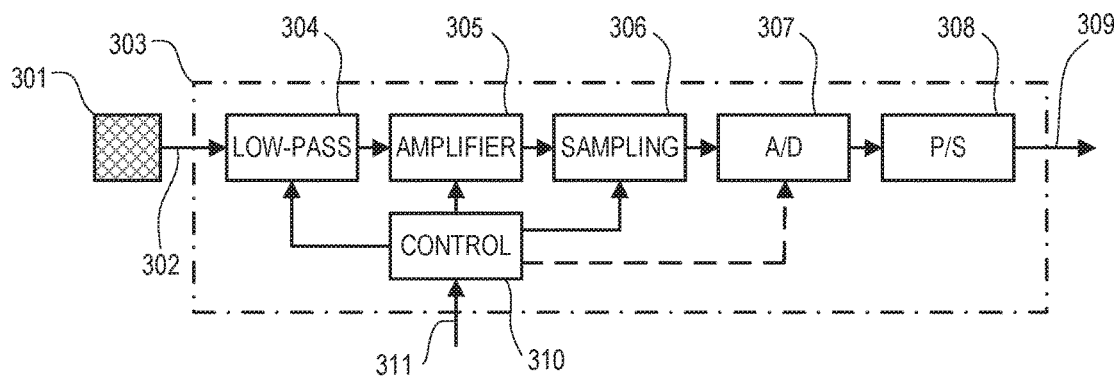
FIG. 3 is a schematic diagram illustrating an exemplary scalable noise and vibration sensor with mixed signal processing.

FIG. 3 depicts an exemplary scalable noise and vibration sensor with mixed signal processing. The noise and vibration sensor shown in FIG. 3 includes an analog acceleration sensor 301, which provides an analog sense signal 302, and a sense signal processing module 303, which includes an analog low-pass filter 304 with controllable cut-off frequency and an analog amplifier 305 with controllable gain. The low-pass filter 304 is connected downstream of the acceleration sensor 301 and the amplifier 305 is connected downstream of the low-pass filter 304. A sample and hold element 306 with a controllable sample rate is connected downstream of the amplifier 305. The sample and hold element 306 generates time-discrete samples with analog values from an analog output signal of amplifier 305.

The time-discrete samples with analog values are converted into time-discrete samples with digital (binary) values by way of an analog-to-digital converter 307 which may output in a parallel data format the number N of bits. The parallel formatted data may be converted into a serial format by an optional parallel-to-serial converter 308 which outputs a serial data stream 309 with a bit rate that depends on the number N of bits and the sample rate fs of the sample and hold element 306. The cut-off frequency and thus the bandwidth of the low-pass filter 304, the amplification of the amplifier 305 and the sample rate of the sample and hold element 306 are controlled by a control module 310 dependent on a control signal 311 so that, at a smaller bandwidth of the low-pass filter 304, the sample rate of the sample and hold element 306 is lower and the amplification of the amplifier 305 is higher while, at a larger bandwidth of the low-pass filter 304, the sample rate of the sample and hold element 306 is higher and the amplification of the amplifier 305 is lower.

Alternatively, the low-pass filter 304 may be substituted by a band-pass filter whose at least upper cut-off frequency is controllable, and the amplifier 305 may be connected downstream of the acceleration sensor 301 and upstream of the low-pass filter 304, so that the sample and hold element 306 is connected downstream of the low-pass filter 304 (alternatives not shown). Alternatively or additionally to controlling the amplifier 305, the analog-to-digital converter 307 may be controlled by the control module 310 to allow for reducing the number N of bits output by the analog-to-digital converter 307 when the low-pass filter 304 is set for a large bandwidth, while the maximum number N of bits may be used when a small bandwidth is elected. Furthermore, the amplifier 305 may be optional, i.e., can be omitted when the analog-to-digital converter 307 is controlled as described above.

Figure 4:
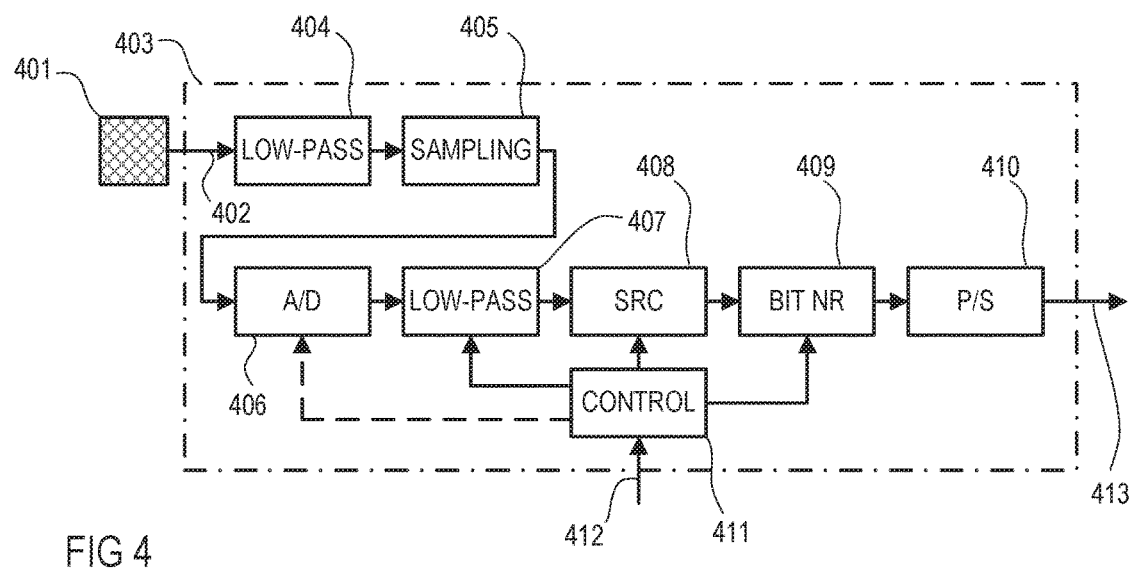
FIG. 4 is a schematic diagram illustrating another exemplary scalable noise and vibration sensor with mixed signal processing.

Referring to FIG. 4, another exemplary scalable noise and vibration sensor with mixed signal processing includes an analog acceleration sensor 401 which provides an analog sense signal 402, and a sense signal processing module 403 which includes an analog low-pass filter 404 (or band-pass filter) with a fixed cut-off frequency (or fixed cut-off frequencies), a subsequent sample and hold element 405 with fixed sample frequency and a subsequent analog-to-digital converter 406 with a fixed number N of bits. The fixed cut-off frequency of low-pass filter 404, the fixed sample rate of sample and hold element 403 and the fixed number N of bits of analog-to-digital converter 406 are set to values that allow for reproduction of the maximum dynamic and maximum bandwidth that the noise and vibration sensor can deliver. The sample and hold element 405 generates time-discrete samples with analog values from an analog output signal of low-pass filter 404. The time-discrete samples with analog values are converted into time-discrete samples with digital (binary) values by way of analog-to-digital converter 406 which may output in a parallel data format the number N of bits. Instead of analog acceleration sensor 401, analog low-pass filter 404, sample and hold element 403 and analog-to-digital converter 406, a digital acceleration sensor (not shown) may be used.

The sense signal processing module 403 further includes a digital low-pass filter 407 with controllable cut-off frequency, a sample rate converter 408 with controllable (changeable) output bit rate, an optional bit number reducer 409 with controllable (changeable) output bit number and an optional parallel-to-serial converter 410. The cut-off frequency and thus the bandwidth of the digital low-pass filter 407, the output sample rate of the sample rate converter 408 and the number of bits of the bit number reducer 409 are controlled by a control module 411 dependent on a control signal 412 so that, at a smaller bandwidth of the low-pass filter 407, the output sample rate of the sample rate converter 408 is lower (and the number of bits output by bit number reducer 409 may be higher) while, at a larger bandwidth of the low-pass filter 407, the output sample rate of the sample rate converter 408 is higher (and the number of bits output by bit number reducer 409 may be lower). As an example, if a constant BDP is desired, the sample rate may be, e.g., R[1/s] and the bit number, e.g., B[bits] at a bandwidth W so that BDP=R·B[bit/s], and the sample rate may be, e.g., 4R[1/s] and the bit number, 0.25 B [bits] at a bandwidth 4 W so that BDP=4R·0.25 B [bit/s]=R·B[bit/s]. Accordingly, parallel-to-serial converter 410 outputs a digital signal 413 with a constant bit rate for two different modes of operation of the noise and vibration sensor.

Instead of the bit number reducer 409, transfer all bits available or only some of them from its input to its output dependent on a corresponding control signal, the analog-to-digital converter 406 may be designed to allow for switching off some of the bits in order educe the number of bits dependent on a respective control signal.

Figure 5:
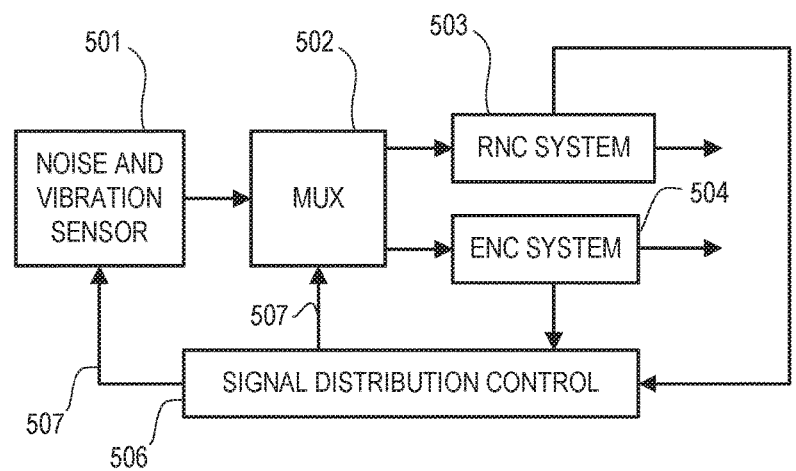
FIG. 5 is a diagram illustrating an example noise cancellation arrangement including a road noise cancellation system, an engine noise control system, and a scalable noise and vibration sensor.

An exemplary scalable noise and vibration sensor 501, such as the sensors described above in connection with FIGS. 1-4, may be connected via a multiplexer 502 to an RNC system 503 and an ENC system 504 as shown in FIG. 5. A signal distribution control module 506 generates a control signal 507, such as the control signals 108, 311 and 412 described above in connection with FIGS. 1, 3 and 4, that controls the noise and vibration sensor 501 and the multiplexer 502 so that, when the RNC system 503 is connected to the noise and vibration sensor 501 via the multiplexer 502, the noise and vibration sensor 501 is controlled to exhibit a high dynamic and a small signal bandwidth. However, when the multiplexer 502 connects the ENC system 504 to the noise and vibration sensor 501, the noise and vibration sensor 501 is controlled to exhibit a low dynamic and a large signal bandwidth. The control signal 507 may be generated on a regular basis (e.g., periodically) or dependent on the operational status of the RNC system 503 and ENC system 504.

Figure 6:
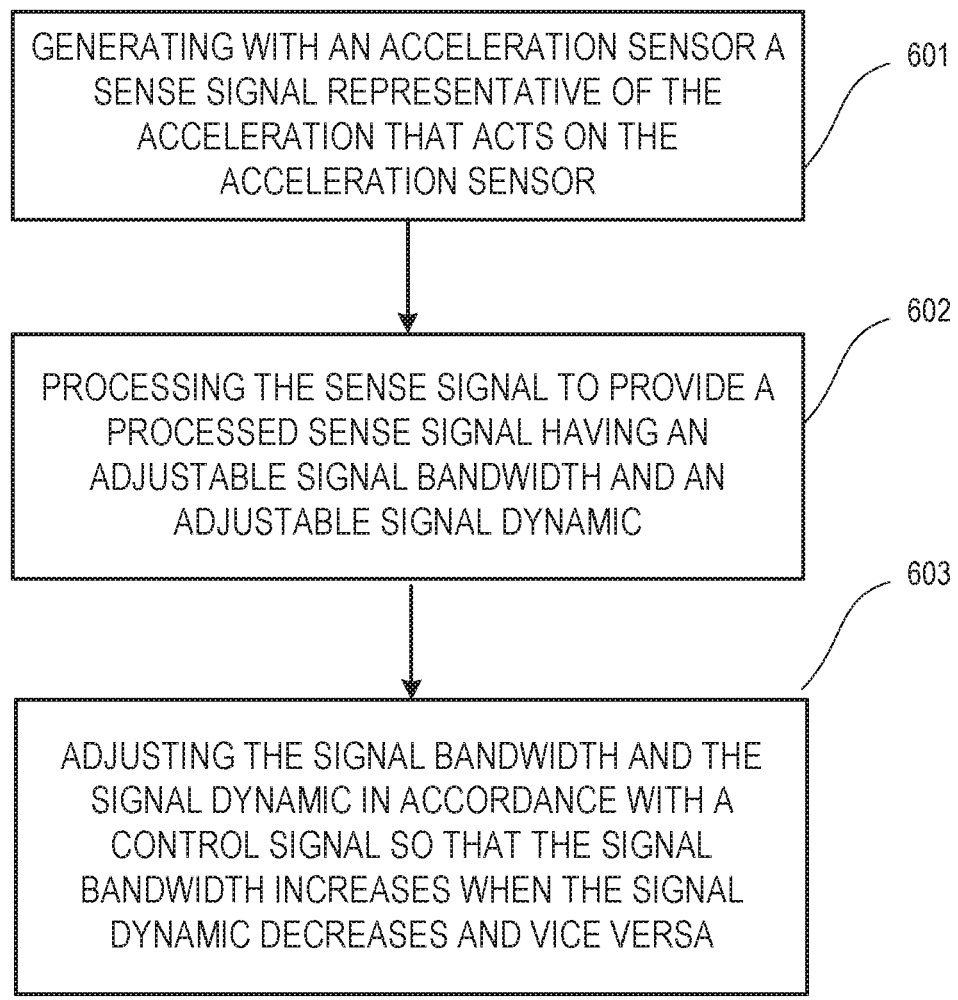
FIG. 6 is a flow chart of an exemplary simple noise and vibration sensing method.

Referring to FIG. 6, in an exemplary noise and vibration sensing method the signal bandwidth extends between a lowest frequency and a highest frequency of the sense signal, and the signal dynamic is the ratio between a maximum amplitude of the sense signal and an output noise floor generated by the acceleration sensor. The method includes generating with an acceleration sensor (such as, e.g., sensors 101, 301 and 401) a sense signal representative of the acceleration that acts on the acceleration sensor (procedure 601) and processing the sense signal to provide a processed sense signal having an adjustable signal bandwidth and an adjustable signal dynamic (procedure 602). The method further comprises adjusting the signal bandwidth and the signal dynamic in accordance with a control signal so that the signal bandwidth increases when the signal dynamic decreases and vice versa (procedure 603).

The description of embodiments has been presented for purposes of illustration and description. Suitable modifications and variations to the embodiments may be performed in light of the above description or may be acquired by practicing the methods. For example, unless otherwise noted, one or more of the described methods may be performed by a suitable device and/or combination of devices. The described methods and associated actions may also be performed in various orders in addition to the order described in this application, in parallel, and/or simultaneously. The described systems are exemplary in nature, and may include additional elements and/or omit elements.

As used in this application, an element or step recited in the singular and proceeded with the word "a" or "an" should be understood as not excluding the plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects. The following claims particularly point out subject matter from the above disclosure that is regarded as novel and non-obvious.

The invention claimed is:

1. A scalable noise and vibration sensor comprising:
an acceleration sensor configured to generate a sense signal representative of acceleration that acts on the acceleration sensor; and
a sense signal processing module configured to process the sense signal to provide a processed sense signal having an adjustable signal bandwidth and an adjustable signal dynamic: wherein
the adjustable signal bandwidth extends between a lowest frequency and a highest frequency of the sense signal, and the signal dynamic is a ratio between a maximum amplitude of the sense signal and an output noise floor generated by the acceleration sensor; and
the sense signal processing module is further configured to adjust the signal bandwidth and the signal dynamic in accordance with a control signal so that the signal bandwidth increases when the signal dynamic decreases and the signal bandwidth decreases when the signal dynamic increases.

2. The sensor of claim 1, wherein the sense signal processing module is further configured to adjust the signal bandwidth and the signal dynamic so that a product of the signal bandwidth and the signal dynamic is constant.

3. The sensor of claim 1, wherein the sense signal processing module comprises:
a first bandpass filter module positioned downstream of the acceleration sensor, the first bandpass filter module having an adjustable first filter bandwidth; and
an amplifier module with an adjustable gain; wherein
the first filter bandwidth and the gain are adjustable so that the gain increases when the first filter bandwidth decreases and the gain decreases when the first filter bandwidth increases.

4. The sensor of claim 3, wherein the sense signal processing module further comprises;
a first signal sampler positioned downstream of the first bandpass filter module, the first signal sampler having a first sampling rate; and
a first analog-to-digital converter positioned downstream of the first signal sampler, the first analog-to-digital converter being configured to provide a first digital processed sense signal having a first number of bits.

5. The sensor of claim 4, wherein at least one of the first sampling rate and the first number of bits is adjustable so that the at least one of the first sampling rate and the first number of bits increases when the first filter bandwidth decreases and the at least one of the first sampling rate and the first number of bits decreases when the first filter bandwidth increases.

6. The sensor of claim 1, wherein the sense signal processing module comprises:
a first bandpass filter module positioned downstream of the acceleration sensor, the first bandpass filter module having an adjustable first filter bandwidth,
a first signal sampler positioned downstream of the first bandpass filter module, the first signal sampler having a first sampling rate; and
a first analog-to-digital converter positioned downstream of the first signal sampler, the first analog-to-digital converter being configured to provide a first digital processed sense signal having a first number of bits; wherein
at least one of the first sampling rate and the first number of bits is adjustable so that the at least one of the first sampling rate and the first number of bits increases when the first filter bandwidth decreases and the at least one of the first sampling rate and the first number of bits decreases when the first filter bandwidth increases.

7. The sensor of claim 6, wherein the sense signal processing module further comprises a parallel-to-serial data converter positioned downstream of a first analog-to-digital converter or a second analog-to-digital converter.

8. A noise cancellation arrangement comprising a road noise cancellation system, an engine noise control system, and noise and vibration sensor according to claim 1, the noise and vibration sensor being connected to the road noise cancellation system and the engine noise control system.

9. A noise and vibration sensing method comprising:
generating with an acceleration sensor, a sense signal representative of an acceleration that acts on the acceleration sensor; and
processing the sense signal to provide a processed sense signal having an adjustable signal bandwidth and an adjustable signal dynamic; wherein
the signal bandwidth extends between a lowest frequency and a highest frequency of the sense signal, and the signal dynamic is a ratio between a maximum amplitude of the sense signal and an output noise floor generated by the acceleration sensor; and
adjusting the signal bandwidth and the signal dynamic in accordance with a control signal so that the signal bandwidth increases when the signal dynamic decreases and the signal bandwidth decreases when the signal dynamic increases.

10. The method of claim 9, wherein processing the sense signal comprises adjusting the signal bandwidth and the signal dynamic so that a product of the signal bandwidth and signal dynamic is kept constant.

11. The method of claim 9, wherein processing the sense signal comprises: filtering with a first bandpass filter having an adjustable first filter bandwidth downstream of the acceleration sensor; and signal amplifying with an adjustable gain; wherein the first filter bandwidth and the gain are adjustable so that the gain increases when the first filter bandwidth decreases and the gain decreases when the first filter bandwidth increases.

12. The method of claim 11, wherein processing the sense signal comprises: sampling with a first signal sampler having a first sampling rate positioned downstream of the first bandpass filter; and
converting, with a first analog-to-digital converter positioned downstream of the first signal sampler, the first analog-to-digital converter being configured to provide a first digital processed sense signal having a first number of bits.

13. The method of claim 12, wherein at least one of the first sampling rate and first number of bits is adjustable so that the at least one of the first sampling rate and the first number of bits increases when the first filter bandwidth decreases and the at least one of the first sampling rate and the first number of bits decreases when the first filter bandwidth increases.

14. The method of claim 9, wherein processing the sense signal further comprises;
filtering, with a first bandpass filter positioned downstream of the acceleration sensor, the first bandpass filter having an adjustable first filter bandwidth;
sampling, with a first signal sampler having a first sampling rate that is positioned downstream of the first bandpass filter; and
converting, with a first analog-to-digital converter that is positioned downstream of the first signal sampler, the first analog-to-digital converter being configured to provide a first digital processed sense signal having a first number of bits; wherein
at least one of the first sampling rate and the first number of bits is adjustable so that the at least one of the first sampling rate and the first number of bits increases when the first filter bandwidth decreases and the at least one of the first sampling rate at the first number of bits decreases when the first filter bandwidth increases.

15. The method of claim 9, wherein processing the sense signal further comprises: converting, with a parallel-to-serial data converter positioned downstream of a first analog-to-digital converter or a second analog-to-digital converter.

16. A scalable noise and vibration sensor comprising:
an acceleration sensor configured to generate a sense signal representative of acceleration that acts on the acceleration sensor; and
a sense signal processing module configured to process the sense signal to provide a processed sense signal having a signal bandwidth and a signal dynamic: wherein
the signal bandwidth extends between a lowest frequency and a highest frequency of the sense signal, and the signal dynamic is a ratio between a maximum amplitude of the sense signal and an output noise floor provided by the acceleration sensor; and
the sense signal processing module is further configured to adjust the signal bandwidth and the signal dynamic based on a control signal so that the signal bandwidth increases when the signal dynamic decreases and the signal bandwidth decreases when the signal dynamic increases.

17. The sensor of claim 16, wherein the sense signal processing module is further configured to adjust the signal bandwidth and the signal dynamic so that a product of the signal bandwidth and the signal dynamic is constant.

18. The sensor of claim 16, wherein the sense signal processing module comprises:
a first bandpass filter module positioned downstream of the acceleration sensor, the first bandpass filter module having an adjustable first filter bandwidth; and
an amplifier module with an adjustable gain; wherein
the first filter bandwidth and the gain are adjustable so that the gain increases when the first filter bandwidth decreases and the gain decreases when the first filter bandwidth increases.

19. The sensor of claim 18, wherein the sense signal processing module further comprises;
a first signal sampler positioned downstream of the first bandpass filter module, the first signal sampler having a first sampling rate; and
a first analog-to-digital converter positioned downstream of the first signal sampler, the first analog-to-digital converter being configured to provide a first digital processed sense signal having a first number of bits.

20. The sensor of claim 19, wherein at least one of the first sampling rate and the first number of bits is adjustable so that the at least one of the first sampling rate and the first number of bits increases when the first filter bandwidth decreases and the at least one of the first sampling rate and the first number of bits decreases when the first filter bandwidth increases.

* * * * *